(12) United States Patent
Kalamatianos et al.

(10) Patent No.: US 9,424,195 B2
(45) Date of Patent: Aug. 23, 2016

(54) DYNAMIC REMAPPING OF CACHE LINES

(71) Applicant: Advanced Micro Devices, Inc., Sunnyvale, CA (US)

(72) Inventors: John Kalamatianos, Arlington, MA (US); Johnsy Kanjirapallil John, Acton, MA (US); Phillip E. Nevius, Arlington, MA (US); Robert G. Gelinas, Needham, MA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 164 days.

(21) Appl. No.: 14/253,785

(22) Filed: Apr. 15, 2014

(65) Prior Publication Data
US 2015/0293854 A1    Oct. 15, 2015

(51) Int. Cl.
| | | |
|---|---|---|
| *G11C 29/44* | (2006.01) | |
| *G06F 12/08* | (2016.01) | |
| *G06F 12/12* | (2016.01) | |
| *G06F 11/10* | (2006.01) | |
| *G11C 15/00* | (2006.01) | |
| *G11C 29/04* | (2006.01) | |

(52) U.S. Cl.
CPC .......... *G06F 12/0864* (2013.01); *G06F 12/121* (2013.01); *G11C 29/4401* (2013.01); *G06F 11/1064* (2013.01); *G06F 12/0802* (2013.01); *G06F 12/0811* (2013.01); *G06F 12/0873* (2013.01); *G06F 12/0888* (2013.01); *G06F 2212/1032* (2013.01); *G06F 2212/28* (2013.01); *G06F 2212/283* (2013.01); *G06F 2212/284* (2013.01); *G06F 2212/403* (2013.01); *G06F 2212/69* (2013.01); *G11C 15/00* (2013.01); *G11C 29/44* (2013.01); *G11C 2029/0409* (2013.01)

(58) Field of Classification Search
CPC ............ G06F 12/0802; G06F 12/0873; G06F 12/0888; G06F 2212/28; G06F 2212/283; G06F 2212/284; G06F 11/1064; G11C 29/44; G11C 29/4401; G11C 29/04
See application file for complete search history.

(56) References Cited

U.S. PATENT DOCUMENTS

| | | | |
|---|---|---|---|
| 7,430,145 B2 | 9/2008 | Weiss et al. | |
| 2003/0110356 A1* | 6/2003 | Williams, III | ...... G06F 12/0859 711/133 |
| 2009/0204766 A1* | 8/2009 | Jacobi | ................. G06F 12/0804 711/133 |
| 2009/0216952 A1* | 8/2009 | Sonnelitter, III | ...... G06F 12/121 711/125 |
| 2012/0278651 A1* | 11/2012 | Muralimanohar | ..... G11C 29/76 714/6.11 |

(Continued)

OTHER PUBLICATIONS

Fred A. Bower et al., "Tolerating Hard Faults in Microprocessor Array Structures". International Conference on Dependable Systems and Networks (DSN), Jun. 2004, 10 pages, Florence, Italy.

(Continued)

*Primary Examiner* — Albert Decady
*Assistant Examiner* — Christian Dorman
(74) *Attorney, Agent, or Firm* — Park, Vaughan, Fleming & Dowler LLP (57) ABSTRACT

A method of managing cache memory includes accessing a cache memory at a primary index that corresponds to an address specified in an access request. A determination is made that accessing the cache memory at the primary index does not result in a cache hit on a cache line with an error-free status. In response to this determination, the primary index is mapped to a secondary index and data for the address is written to a cache line at the secondary index.

17 Claims, 9 Drawing Sheets

(56) References Cited

U.S. PATENT DOCUMENTS

| | | | | | |
|---|---|---|---|---|---|
| 2013/0283126 | A1* | 10/2013 | Ramaraju | ............ | G06F 11/1064 714/763 |
| 2015/0149865 | A1* | 5/2015 | Dong | ...................... | G06F 12/00 714/766 |
| 2015/0286544 | A1* | 10/2015 | Kadri | .................. | G06F 11/2043 714/13 |

OTHER PUBLICATIONS

Wei Zhang et al., "ICR: In-Cache Replication for Enhancing Data Cache Reliability", International Conference on Dependable Systems and Networks (DSN), Jun. 2003, 10 pages.

Stanley E. Schuster, "Multiple Word/Bit Line Redundancy for Semiconductor Memories", IEEE Journal of Solid State Circuits, vol. SC-13, No. 5, Oct. 1978, 6 pages.

Chris Wilkerson et al., "Trading off Cache Capacity for Reliability to Enable Low Voltage Operation", International Symposium on Computer Architecture, Jun. 2008, 12 pages.

Amin Ansari et al., "ZerehCache: Armoring Cache Architectures in High Defect Density Technologies", Micro, 11 pages, Dec. 12-16, 2009, New York, NY, USA.

Zeshan Chishti et al., "Improving Cache Lifetime Reliability at Ultra-Low Voltages", Micro, 11 pages, Dec. 12-16, 2009, New York, NY, USA.

James Abella et al., "Low Vccmin Fault-Tolerant Cache with Highly Predictable Performance", Micro, 11 pages, Dec. 12-16, 2009, New York, NY, USA.

Gabriel H. Loh et al., "Dirty Cacheline Duplication", U.S. Appl. No. 13/720,536, filed Dec. 19, 2012, 30 pages.

* cited by examiner

DYNAMIC REMAPPING OF CACHE LINES

STATEMENT OF GOVERNMENT INTEREST

This invention was made with Government support under Prime Contract Number DE-AC52-07NA27344, Subcontract Number B600716 awarded by DOE. The Government has certain rights in this invention.

TECHNICAL FIELD

The present embodiments relate generally to cache memory, and more specifically to error protection in cache memory.

BACKGROUND

Cache memories may be affected by both intermittent and permanent errors, which affect the performance of the system and may limit the lifetime of the system. Also, occurrence of errors may increase at low voltages, such that operating a system at a low voltage to save power may reduce the reliability of the system. Accordingly, there is a need for cache memory management techniques that provide error protection.

SUMMARY OF ONE OR MORE EMBODIMENTS

Embodiments are disclosed in which indices in a cache memory are remapped in response to errors in cache lines and/or cache misses.

In some embodiments, a method of managing cache memory includes accessing a cache memory at a primary index that corresponds to an address specified in an access request. A determination is made that accessing the cache memory at the primary index does not result in a cache hit on a cache line with an error-free status. In response to this determination, the primary index is mapped to a secondary index and data for the address is written to a cache line at the secondary index.

In some embodiments, a cache controller includes a mapping module to map a primary index to a secondary index. The primary index corresponds to an address specified in an access request. The cache controller also includes a status indicator array to store status indicators for cache lines. The cache controller further includes cache control logic to write data for the address to a cache line at the secondary index in response to a determination that an access at the primary index does not result in a cache hit on a cache line with an error-free status.

The disclosed embodiments provide run-time error protection that improves cache memory reliability.

BRIEF DESCRIPTION OF THE DRAWINGS

The present embodiments are illustrated by way of example and are not intended to be limited by the figures of the accompanying drawings.

Like reference numerals refer to corresponding parts throughout the figures and specification.

DETAILED DESCRIPTION

Reference will now be made in detail to various embodiments, examples of which are illustrated in the accompanying drawings. In the following detailed description, numerous specific details are set forth in order to provide a thorough understanding of the disclosure. However, some embodiments may be practiced without these specific details. In other instances, well-known methods, procedures, components, and circuits have not been described in detail so as not to unnecessarily obscure aspects of the embodiments.

Figure 1:
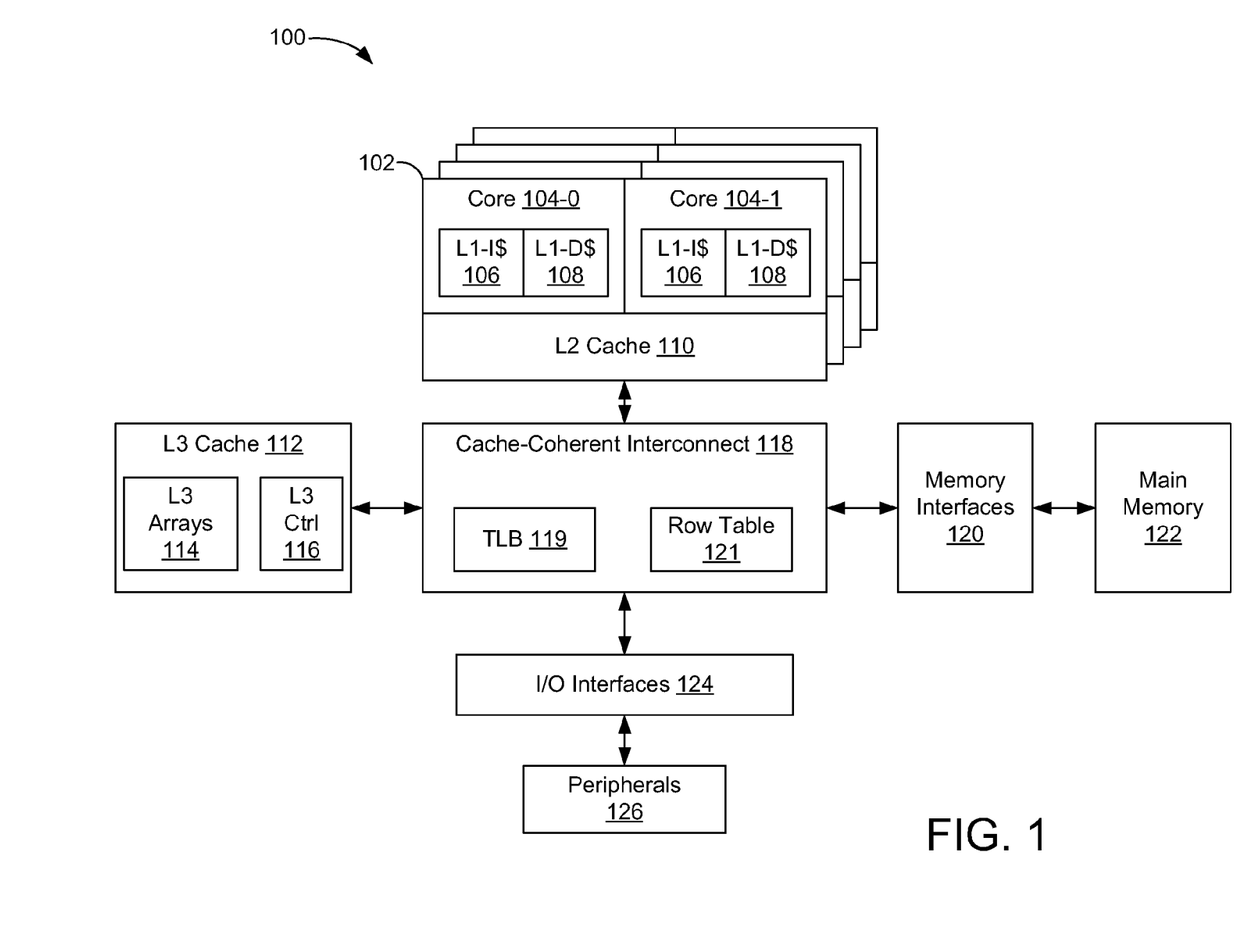
FIG. 1 is a block diagram showing a computing system in accordance with some embodiments.

FIG. 1 is a block diagram showing a computing system 100 in accordance with some embodiments. The computing system 100 includes a plurality of processing modules 102 (e.g., four processing modules 102), each of which includes a first processor core 104-0 and a second processor core 104-1. The processor cores 104-0 and 104-1 may include one or more central processing unit (CPU) cores, graphics processing unit (GPU) cores, digital signal processing (DSP) cores, and/or other processor cores. Each of the processor cores 104-0 and 104-1 includes a level 1 instruction cache memory (L1-I$) 106 to cache instructions to be executed by the corresponding processor core 104-0 or 104-1 and a level 1 data cache (L1-D$) memory 108 to store data to be referenced by the corresponding processor core 104-0 or 104-1 when executing instructions. A level 2 (L2) cache memory 110 is shared between the two processor cores 104-0 and 104-1 on each processing module 102.

A cache-coherent interconnect 118 couples the L2 cache memories 110 (or L2 caches 110, for short) on the processing modules 102 to a level 3 (L3) cache memory 112. The L3 cache 112 includes L3 memory arrays 114 to store information (e.g., data and instructions) cached in the L3 cache 112. Associated with the L3 cache 112 is an L3 cache controller (L3 Ctrl) 116. (The L1 caches 106 and 108 and L2 caches 110 also include memory arrays and have associated cache controllers, which are not shown in FIG. 1 for simplicity.)

In the example of FIG. 1, the L3 cache 112 is the lowest-level cache memory in the computing system 100 and is therefore referred to as the lowest-level cache or last-level cache (LLC). In other examples, a computing system may include an LLC below the L3 cache 112. In some embodiments, the L1 caches 106 and 108, L2 caches 110, and L3 cache 112 are implemented using static random-access memory (SRAM).

In addition to coupling the L2 caches 110 to the L3 cache 112, the cache-coherent interconnect 118 maintains cache coherency throughout the system 100. The cache-coherent interconnect 118 is also coupled to main memory 122 through memory interfaces 120. In some embodiments, the main memory 122 is implemented using dynamic random-access memory (DRAM). In some embodiments, the memory interfaces 120 coupling the cache-coherent interconnect 118 to the main memory 122 are double-data-rate (DDR) interfaces.

The cache-coherent interconnect 118 is also connected to input/output (I/O) interfaces 124, which allow the cache-coherent interconnect 118, and through it the processing modules 102 and main memory 122, to be coupled to peripheral devices 126.

The L1 caches 106 and 108, L2 caches 110, L3 cache 112, and main memory 122 form a memory hierarchy in the computing system 100. Each level of this hierarchy has less storage capacity but faster access time than the level below it: the L1 caches 106 and 108 offer less storage but faster access than the L2 caches 110, which offer less storage but faster access than the L3 cache 112, which offers less storage but faster access than the main memory 122.

A respective level of cache memory in the computing system 100 may be inclusive or non-inclusive with respective to another level of cache memory (e.g., an adjacent level of cache memory) in the computing system 100. When a first level of cache memory is inclusive with respect to a second level, a cache line in the first level is guaranteed to also be in the second level. When a first level of cache memory is non-inclusive with respect to a second level, a cache line in the first level is not guaranteed to also be in the second level. One example of non-inclusive cache memory is exclusive cache memory. When a first level of cache memory is exclusive with respect to a second level, a cache line in the first level is guaranteed not to be in the second level. For example, if an L2 cache 110 is inclusive with respect to the L3 cache 112, a cache line in the L2 cache 110 is guaranteed to also be in the L3 cache 112. If an L2 cache 110 is non-inclusive with respect to the L3 cache 112, a cache line in the L2 cache 110 is not guaranteed to also be in the L3 cache 112. If an L2 cache 110 is exclusive with respect to the L3 cache 112, a cache line in the L2 cache 110 is guaranteed not to be in the L3 cache 112.

The computing system 100 may also include tables and/or buffers implemented as cache memories. For example, a translation look-aside buffer (TLB) 119 and/or a row table 121 in the cache-coherent interconnect 118 may each be implemented as a cache memory. The TLB 119 is used to translate virtual addresses to physical addresses. The row table 121 is used to track open rows in the main memory 122. Other examples of structures that may be implemented as cache memories in a system such as the computing system 100 include, but are not limited to, branch target buffers (BTBs) and predictor tables (e.g., indirect-branch predictor tables, conditional-branch prediction tables, memory-dependence predictor tables, local-address predictor tables, value predictor tables, etc.).

The computing system 100 is merely an example of a computing system with cache memory; other configurations are possible. For example, the number of processor cores per processing module 102 may vary, as may the number of processing modules 102. More than two processor cores may share an L2 cache 110, or each processor core 104-0 and 104-1 may have its own L2 cache 110. Other examples are possible.

Figure 2:
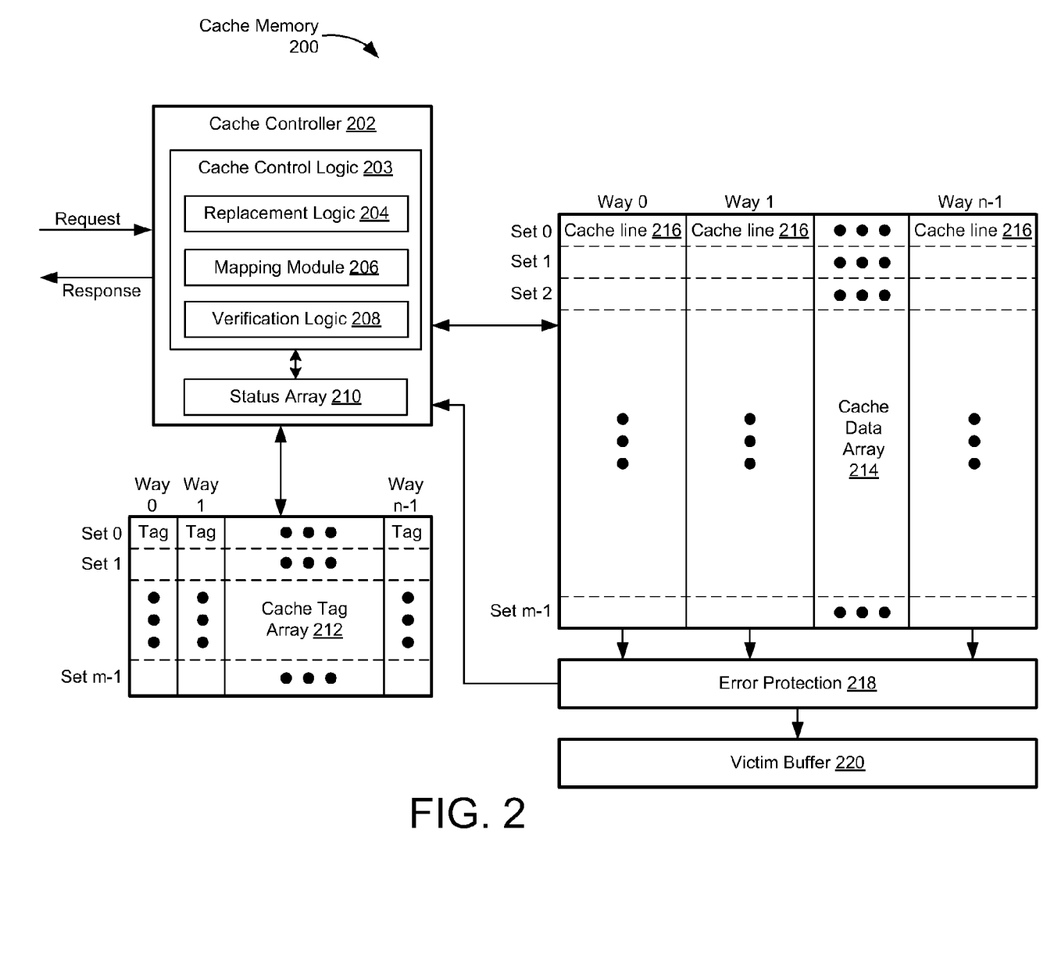
FIG. 2 is a block diagram of a cache memory in accordance with some embodiments.

FIG. 2 is a block diagram of a cache memory 200 in accordance with some embodiments. The cache memory 200 may be a particular level of cache memory (e.g., the L3 cache 112, an L2 cache 110, or an L1 cache 106 or 108, FIG. 1) in a computing system such as the computing system 100 (FIG. 1). Alternatively, the cache memory 200 may be a table or buffer implemented as a cache memory. The cache memory 200 includes a cache data array 214 and a cache tag array 212. (The term data as used in the context of the cache data array 214 may include instructions as well as data to be referenced when executing instructions.) A cache controller 202 is coupled to the cache data array 214 and cache tag array 212 to control operation of the cache data array 214 and cache tag array 212.

The cache data array 214 is divided into sets of cache lines 216 in which data is stored. The sets are indexed by indices determined based on addresses for data cached in respective cache lines 216. The indices are determined by applying a hashing function to the addresses (i.e., by hashing the addresses). Indices determined in this manner are referred to herein as primary indices. For example, addresses for data cached in respective cache lines 216 in the cache data array 214 are divided into multiple address portions, including an index (i.e., a primary index) and a tag. (A cache line 216 may correspond to a plurality of addresses that share common index and tag portions.) Extracting the index from the address is an example of applying a hashing function to the address. In this example, cache lines 216 are installed in the cache data array 214 at locations indexed by the index portions of the addresses. Tags are stored in the cache tag array 212 at locations indexed by the index portions of the addresses. These addresses are typically physical addresses, but in some embodiments may be virtual addresses. In some embodiments (e.g., in accordance with the method 400, FIGS. 4A-4F), only one copy of a given tag is stored at a particular index in the cache tag array 212.

To perform a memory access operation in the cache memory 200, a memory access request is provided to the cache controller 202 (e.g., from a processor core 104-0 or 104-1, or from a higher level of cache memory in the computing system 100, FIG. 1). The memory access request specifies an address. If a tag stored at a location in the cache tag array 212 indexed by the index corresponding to the address (i.e., the primary index) matches the tag portion of the address, and if a remapping bit has an appropriate value (as described below), then a cache hit occurs. Otherwise, a cache miss occurs. For a read request that results in a cache hit, the cache line 216 at a corresponding location in the cache data array 214 is returned in response to the request. For a write request that results in a cache hit, the cache line 216 at the corresponding location in the cache data array 214 is modified.

The cache data array 214 may store multiple copies of a cache line 216. A primary copy may be stored at a primary index, which is determined based on an address (or addresses) of data stored in the cache line 216. The primary index may be mapped to a secondary index, at which a secondary copy of the cache line 216 is stored. This mapping may be performed using a hashing function, which may be distinct from the hashing function used to determine the primary index based on the address. The secondary index may be accessed, for example, if an error is detected in the primary cache line 216. If an access at a secondary index results in a tag match, and if a remapping bit has an appropriate value (as described below), then a cache hit occurs. Otherwise, a cache miss occurs. Examples of accessing the secondary index are described below with respect to the method 400 (FIGS. 4A-4F).

The cache data array 214, and thus the cache memory 200, is set-associative: for each index, it includes a set of n locations at which a particular cache line 216 may be installed, where n is an integer greater than one. The cache data array 214 is thus divided into n ways, numbered 0 to n−1; each location in a given set is situated in a distinct way. Examples of n include, but are not limited to, eight and 16 (i.e., eight ways and 16 ways, respectively). The cache data array 214 includes m sets, numbered 0 to m−1, where m is an integer greater than one. The cache tag array 212 is similarly divided into sets and ways. A cache hit resulting from a tag match in a particular way at a specified index in the cache tag array 212 indicates that the cache line 216 in the particular way at the specified index in the cache data array 214 is the cache line 216 to be accessed.

Storing multiple copies of cache lines 216 at distinct indices in the cache reduces the associativity of the cache memory 200 but improves the reliability of the cache memory 200.

A primary copy of a new cache line 216 to be installed in the cache data array 214 may be installed in any way of the set specified by the primary index. Similarly, a secondary copy of a new cache line 216 to be installed in the cache data array 214 may be installed in any way of the set specified by the secondary index. If all of the ways in the specified set already have valid cache lines 216, then a cache line 216 may be either evicted or dropped from one of the ways and the respective copy of the new cache line 216 installed in its place. The cache line 216 to be evicted or dropped, which is referred to as the victim cache line 216, may be selected based on a replacement policy. Examples of replacement policies include, but are not limited to, least-recently-used (LRU) and least-frequently used (LFU). Evicted cache lines 216 are written back to a lower level of memory, while dropped cache lines 216 are simply replaced with the new cache line 216. If write-back is to be performed (e.g., because the evicted cache line 216 is modified or because the cache memory 200 is exclusive with respect to a lower-level cache memory), the victim cache line 216 is placed in a victim buffer 220, from where it is written back to a lower-level cache memory (or to main memory 122) in the computing system 100 (FIG. 1).

In some embodiments, an error protection module 218 is coupled to the cache data array 214 to detect and/or correct errors in cache lines 216 read from the cache data array 214. For example, the error protection module 218 performs parity-based error detection of single-bit errors, using parity bits stored in the cache lines 216. In other examples, the error protection module uses error-correction coding (ECC) to detect and correct errors in cache lines 216. Examples of ECC include, but are not limited to, SECDED (single error correction, double error detection) coding, which corrects single-bit errors and detects double-bit errors, and DECTED (double error correction, triple error detection), which corrects up to double-bit errors and detects triple-bit errors. In some embodiments, the error protection module 218 is omitted.

The cache controller 202 includes cache control logic 203, which includes replacement logic 204, a mapping module 206, and verification logic 208. The replacement logic 204 implements a replacement policy for selecting cache lines 216 in respective sets to be evicted or dropped. The mapping module 206 implements the mapping function (e.g., a hashing function, which may be distinct from the hashing function used to determine primary indices based on addresses) that maps primary indices to secondary indices. In some embodiments, the mapping function is reversible, such that it provides reverse mapping: if the mapping function is applied to a first index to produce a second index, then applying the mapping function to the second index produces the first index, for all indices. The verification logic 208 allows for verification of data written to cache lines 216. Data written to a cache line 216 may be read back (e.g., as part of the process of writing the data) and compared to the original data (e.g., as fetched from a lower level of memory). The verification logic 208 may include a buffer to store the original data and a comparator to compare the data as read from the cache line 216 to the original data. The verification logic 208 thus may detect any number of errors in the data as read from the cache line 216, in accordance with some embodiments.

Figure 3:
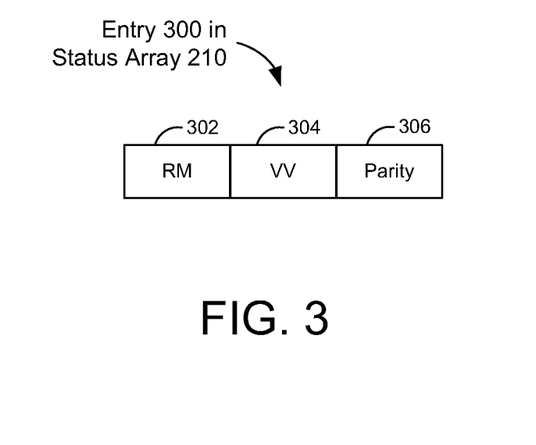
FIG. 3 is a data structure showing an entry in a cache line status array in a cache controller in accordance with some embodiments.

The cache controller 202 also includes a status array 210 that stores status information for the cache lines 216 in the cache data array 214. Each entry in the status array 210 corresponds to a distinct cache line 216. The entries are indexed, for example, by set and way. FIG. 3 shows an example of an entry 300 in the status array 210. Each entry 300 includes a field 302 that stores a remapping bit (RM). The remapping bit indicates whether the cache line 216 corresponding to the entry 300 is a primary copy or a secondary copy. For example, the cache line 216 is a primary copy if RM=0 and a secondary copy if RM=1. (This convention, which is used throughout herein, may be reversed.) On an access to a primary index, a cache miss occurs if there is no tag match or if a tag match occurs for a cache line 216 with RM=1. A cache hit occurs if there is a tag match for a cache line 216 with RM=0. On an access to a secondary index, a cache miss occurs if there is no tag match or if a tag match occurs for a cache line 216 with RM=0. A cache hit occurs if there is a tag match for a cache line 216 with RM=1.

Each entry 300 also includes a field 304 that stores a pair of validity bits (VV). The pair of validity bits serves as a status indicator that indicates whether or not the cache line 216 corresponding to the entry 300 is valid and also indicates an error status of the cache line 216. For example, the cache line is valid and error-free if VV=11, is valid with a first error status if VV=01, is valid with a second error status if VV=10, and is invalid (and thus effectively empty) if VV=00. (This convention, which is used throughout herein, is arbitrary and may vary between different embodiments.) The first error status is a transient error status that is assigned between detection of an error and the writing of correct data, while the second error status is a hard error status assigned in response to a failed attempt to write correct data. Examples of setting the value of VV are provided below with respect to the method 400 (FIGS. 4A-4F). In some embodiments, each entry 300 also includes a field 306 that stores a parity bit for the entry 300. The parity bit provides error protection for RM and VV.

Attention is now directed to a method of managing the cache memory 200.

FIGS. 4A-4F are flowcharts showing a method 400 of managing cache memory in accordance with some embodiments. The method 400 is performed (402), for example, in a cache controller for a cache memory (e.g., by the cache control logic 203 in the cache memory 200, FIG. 2). In some embodiments, the cache control logic 203 includes a state machine that performs the method 400.

Figure 4A:
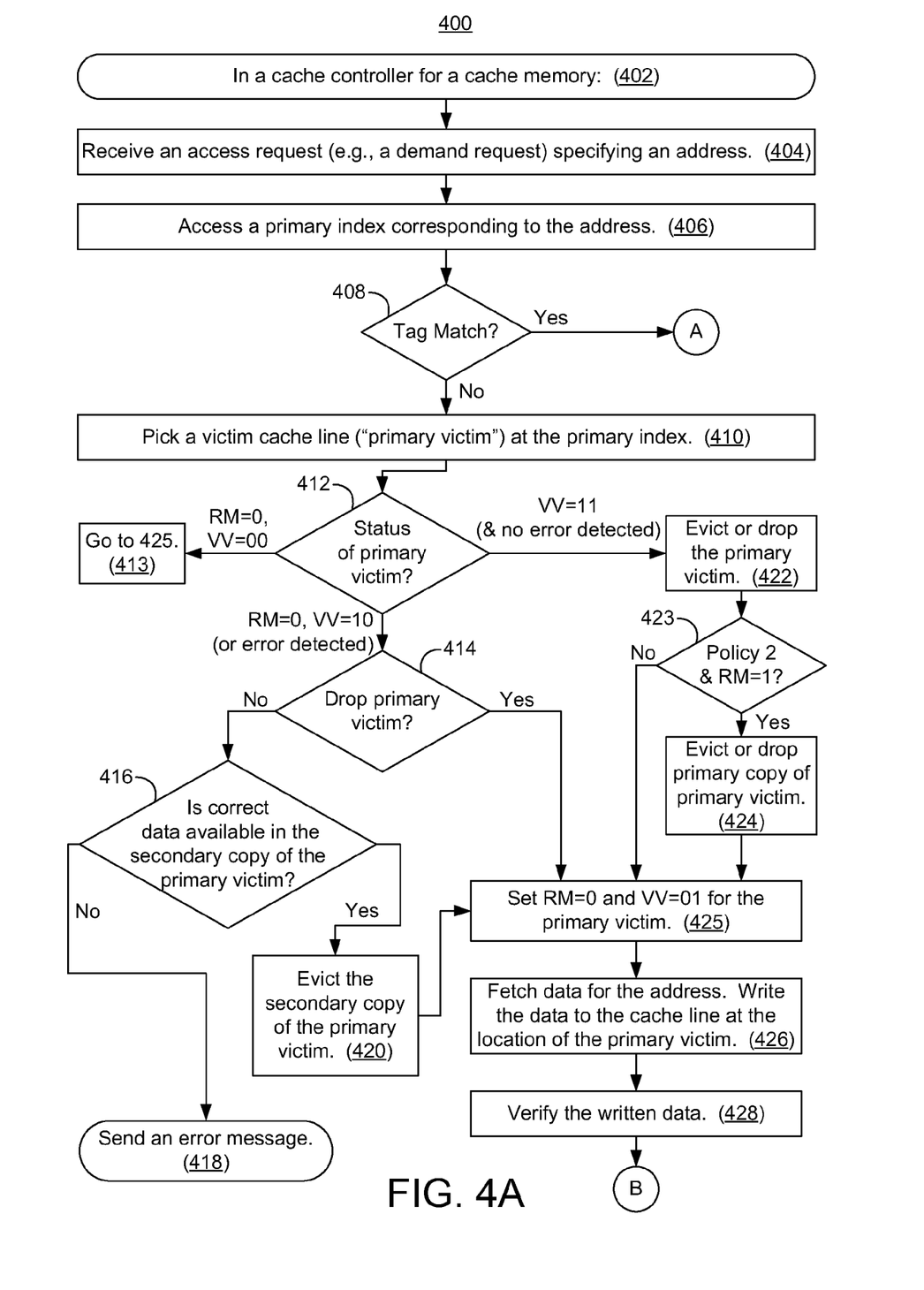
FIGS. 4A-4F are flowcharts showing a method of managing cache memory in accordance with some embodiments.

In the method 400, an access request is received (404) that specifies an address. In some embodiments, the access request is a demand request (e.g., as opposed to a request generated by a prefetcher). The access request may be a read request or a write request.

A primary index that corresponds to the address is accessed (406). If a tag match occurs (408—Yes), the method 400 branches to operation 474 (FIG. 4D, described below). If a tag match does not occur (408—No), then a victim cache line is picked (410), and thus selected, at the primary index. This victim cache line is referred to as the primary victim.

The status of the primary victim (e.g., as specified in the entry 300 of the primary victim) is checked (412). This status check includes checking the RM value and/or the VV value. In some embodiments, this status check also includes performing error detection (e.g., using the error protection module 218) to determine whether the primary victim includes an error (e.g., an uncorrectable error). If VV=11, indicating that the primary victim is valid and error free, and in some embodiments if no error is detected (e.g., by the error protection module 218, FIG. 2), then the primary victim is either evicted or dropped (422). Furthermore, if RM=1, indicating that the primary victim is a secondary copy of another cache line 216, then one of two policy options may be implemented. In some embodiments, error-free secondary copies (e.g., RM=1, VV=11) are replaced in the cache memory 200 without replacing faulty primary copies (e.g., RM=0, VV=10). This policy is referred to as Policy 1. Alternatively, faulty primary copies are invalidated when an error-free secondary copy is evicted or dropped. This policy is referred to as Policy 2. Therefore, if the primary victim is a secondary copy, as indicated by RM=1, and if Policy 2 is used (423—Yes), then the primary copy of the primary victim is evicted or dropped (424). (Furthermore, when a faulty primary copy (e.g., RM=0, VV=10) is evicted or dropped, its valid and error-free secondary copy (e.g., RM=1, VV=11) is invalidated to maintain coherence, in accordance with some embodiments.) If the primary victim is a secondary copy, as indicated by RM=1, and if Policy 1 is used (423—No), then the primary copy of the primary victim is left intact. In either case, the method 400 then proceeds to operation 425 (described below). Likewise, if VV=11 (and in some embodiments no uncorrectable error is detected) and RM=0 (423—No), then the method 400 proceeds to operation 425 (described below).

If RM=0 and VV=00, indicating that the primary victim is invalid and thus empty, then the method 400 then branches (413) to operation 425 (described below).

If checking (412) the status of the primary victim reveals that RM=0 and VV=10, indicating that the primary victim is a primary copy that contains an error, or if RM=0 and an error (e.g., an uncorrectable error) is found by the error protection module 218, then one of two paths result. In some embodiments, the primary victim is dropped (414—Yes). The status (e.g., in the entry 300) of the primary victim is set (425) to RM=0 (in preparation for writing the data requested by the access request) and VV=01. Alternatively, the primary victim is not dropped (414—No). Instead, it is determined (416) whether correct data is available in the secondary copy of the primary victim. If the correct data is available (416—Yes), then the secondary copy of the primary victim is evicted (420). The status of the primary victim is set (425) to RM=0 and VV=01. If the correct data is not available (416—No), then an error message is generated and sent (418) for logging. For example, the error message is sent to a machine check architecture (MCA), which logs the error and may raise an exception in response to the error.

After the status of the primary victim is set (425) to RM=0 and VV=01, data for the address specified in the access request of operation 404 is fetched (426) from a lower level of memory. Once fetched, the data is written (426) to the primary victim: a cache line 216 storing the data is installed at the location of the primary victim (as opposed to the primary victim being modified). The VV value for the primary victim thus equals 01 while the data is fetched. Cache lines 216 for which VV=01 are excluded from consideration for being dropped or evicted. Setting VV=01 for the primary victim therefore effectively reserves the primary victim for the data while the data is fetched, which takes numerous clock cycles (e.g., hundreds of cycles).

The data written to the primary victim is verified (428). For example, the data written to the primary victim is read back and the verification logic 208 (FIG. 2) compares it to the fetched data. Alternatively, the error protection module 218 (FIG. 2) verifies the data as written to the primary victim and notifies the cache control logic 203 of the result. Operation 428 may be triggered by detecting that VV=01 for the newly installed cache line 216.

In some embodiments, the verification of operation 428 is performed if VV for the primary victim equals 10 (before the operation 425) but not if VV for the primary victim equals 00 (before the operation 425). The verification of operation 428 therefore may be selectively performed based on the error status of the primary victim.

If the data is verified to be correct (430—Yes, FIG. 4B), then the status (e.g., in the entry 300) for the primary victim is updated (432) to set RM=0 and VV=11, thus indicating that this cache line 216 is a primary copy that is valid and error-free. The data is returned (434) in response to the access request of operation 404, and the method 400 ends.

Figure 4B:
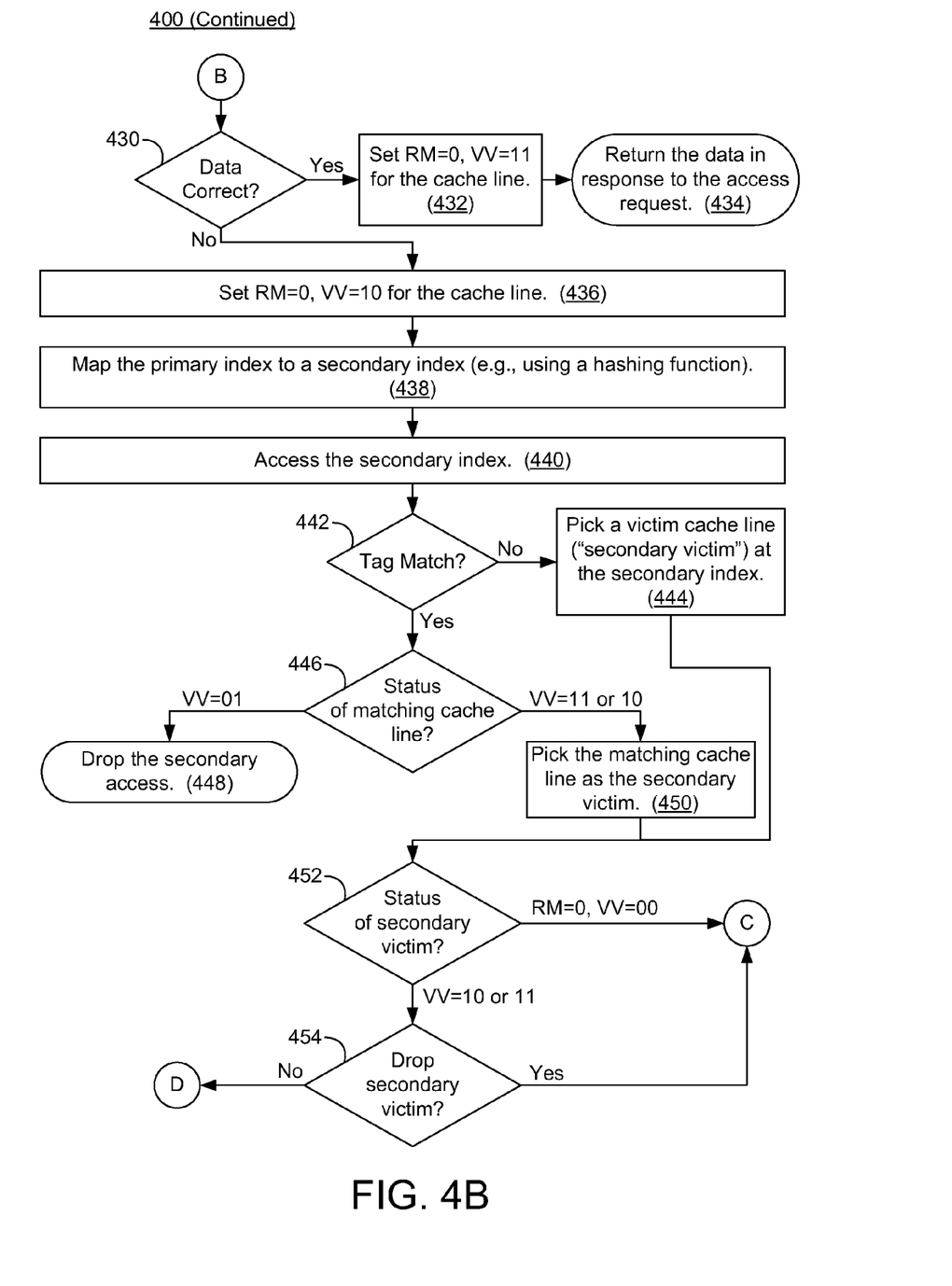

If one or more errors are found, the data is determined to be incorrect (430—No, FIG. 4B). In this case, the status (e.g., in the entry 300) for the primary victim is updated (436) to set RM=0 and VV=10, thus indicating that this cache line 216 is a primary copy with the second error status. The mapping module 206 maps (438) the primary index is to a secondary index. The secondary index is accessed (440).

If the access at the secondary index results in a tag match (442-Yes), then the status (e.g., in the entry 300) of the matching cache line 216 at the secondary index is checked (446). The value of RM for the matching cache line 216 is expected to be 0, because the replacement logic 204 invalidates secondary copies when their primary copies are dropped or evicted. A cache line with RM=1 that would have produced a tag match in response to the access of operation 440 therefore would already have been invalidated. Accordingly, in some embodiments only the value of VV is checked (446). If VV=11 or 10, then the matching cache line 216 is selected (450) as a victim cache line 216 at the secondary index (i.e., as a "secondary victim"). If VV=01, however, then the matching cache line 216 is not selected as the secondary victim, because the replacement logic 204 excludes cache lines 216 with VV=01 from victimization. In this case, the secondary access may be dropped (448) and the method 400 ends. An error message may be generated and sent to the MCA indicating that the access request failed.

If the access at the secondary index does not result in a tag match (442—No), then the replacement logic 204 (FIG. 2) selects (444) a secondary victim.

The status of the secondary victim is checked (452). If RM=0 and VV=00, indicating that the secondary victim is invalid and thus empty, then the status (e.g., in the entry 300) of the secondary victim is updated (462, FIG. 4C) to set RM=1 and VV=01. Assuming data for the address specified in the access request of operation 404 can be fetched (463—Yes), the data is fetched (464) and written to the secondary victim (i.e., to the cache line 216 at the location of the secondary victim). In some embodiments, this data is buffered in the cache controller 202, since it already has been fetched from a lower level of memory in the operation 426. Accordingly, the operation 464 may involve fetching the data from a buffer in the cache controller 202 instead of from a lower level of memory. If data for the address specified in the access request of operation 404 cannot be fetched (463—No), then an error message is generated and sent (458) (e.g., to the MCA).

If VV=10 or 11 for the secondary victim, as determined in the operation 452, then the secondary victim may or may not be dropped (454). If the secondary victim is dropped (454—Yes), then the method 400 proceeds to the operation 462 (described above). If the secondary victim is not dropped (454—No), then it is determined (456, FIG. 4C) whether correct data is available in the secondary copy of the secondary victim. If correct data is available in the secondary copy of the secondary victim (456—Yes), then the secondary copy of the secondary victim is evicted (460). The status (e.g., in the entry 300) of the secondary victim is updated (462) to set RM=1 and VV=01. It is determined (463) whether data for the address can be fetched from a lower level of memory. If so (463—Yes), the data is fetched (464) and written to the secondary victim, and the method 400 proceeds to operation 466 (below). If data cannot be fetched, however, (463—No), then an error message is generated and sent (458) for logging (e.g., to the MCA, which may raise an exception in response), and the method 400 ends. If correct data is not available in the secondary copy of the secondary victim (456—No), then an error message is generated and sent (458) (e.g., to the MCA).

Figure 4C:
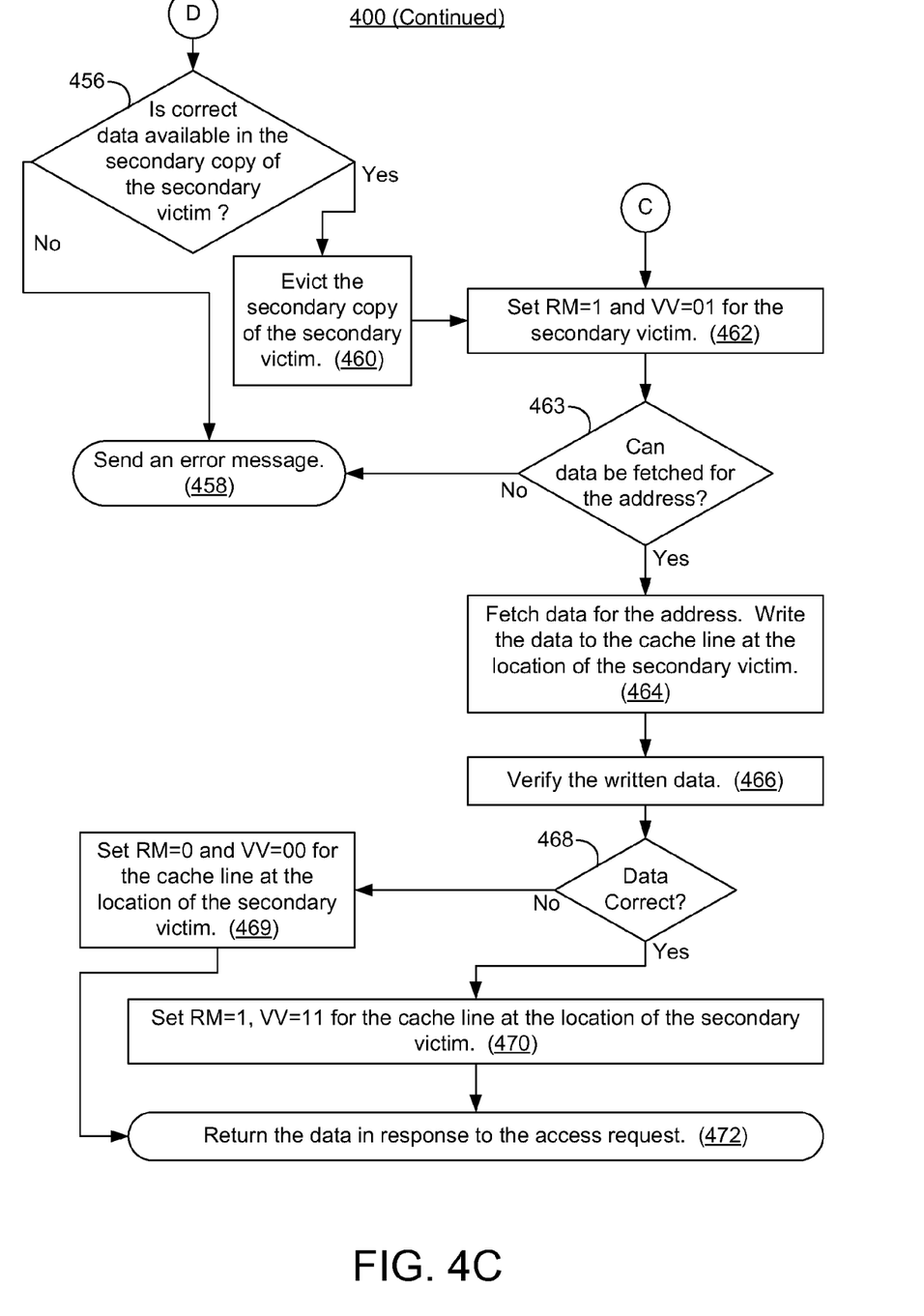
Figure 4D:
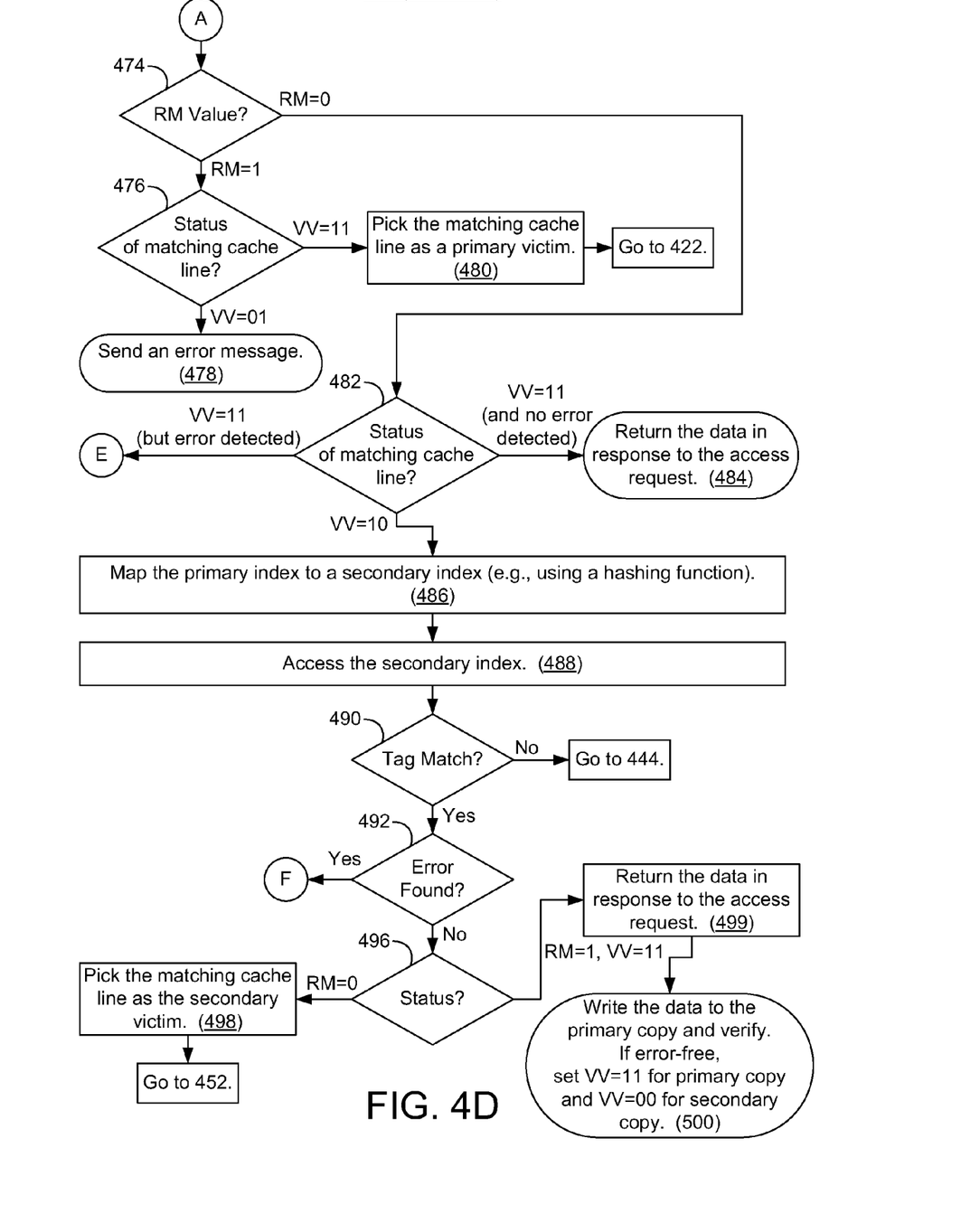

After the operation 464, the data written to the secondary victim is verified (466) (e.g., by the verification logic 208 or the error protection module 218, FIG. 2). If one or more errors are found, the data is determined to be incorrect (468—No). In some embodiments, this determination results in the status (e.g., in the entry 300) of the cache line at the location of the secondary victim being updated (469) to set RM=0 and VV=00. The fetched data is returned (472) in response to the access request of operation 404 without having been stored correctly in the cache memory 200.

If no errors are found in the data as written to the secondary victim (468—Yes), then the status (e.g., in the entry 300) of the secondary victim is updated (470) to set RM=1 and VV=11, indicating that this cache line 216 now stores an error-free secondary copy of the fetched data. (The secondary victim therefore is no longer considered a victim at this point: a new cache line 216 storing the fetched data is installed at the location of the secondary victim.) The data is returned (472) in response to the access request of operation 404, and the method 400 ends.

If accessing (406, FIG. 4A) the primary index results in a tag match (408—Yes), then the RM value of the matching cache line 216 is checked (474, FIG. 4D) and the status of the matching cache line is checked (476 or 482). (In the specific examples of operations 476 and 482, the RM value is considered to be separate from the status, but in other contexts the status may include the RM value.) If RM=1, then the tag match is not a cache hit, because the matching cache line 216 is a secondary copy of another cache line 216 that happens to have the same tag as the address specified in the access request of operation 404. This situation is referred to as aliasing. If RM=1 and VV=11, then the matching cache line 216 is selected (480) as the primary victim, and the method 400 branches to operation 422 (FIG. 4A). If RM=1 and VV=01, then the matching cache line 216 is excluded from selection as the primary victim. Instead, an error message is generated and sent (478) for logging (e.g., to the MCA), and the method 400 ends.

Figure 4E:
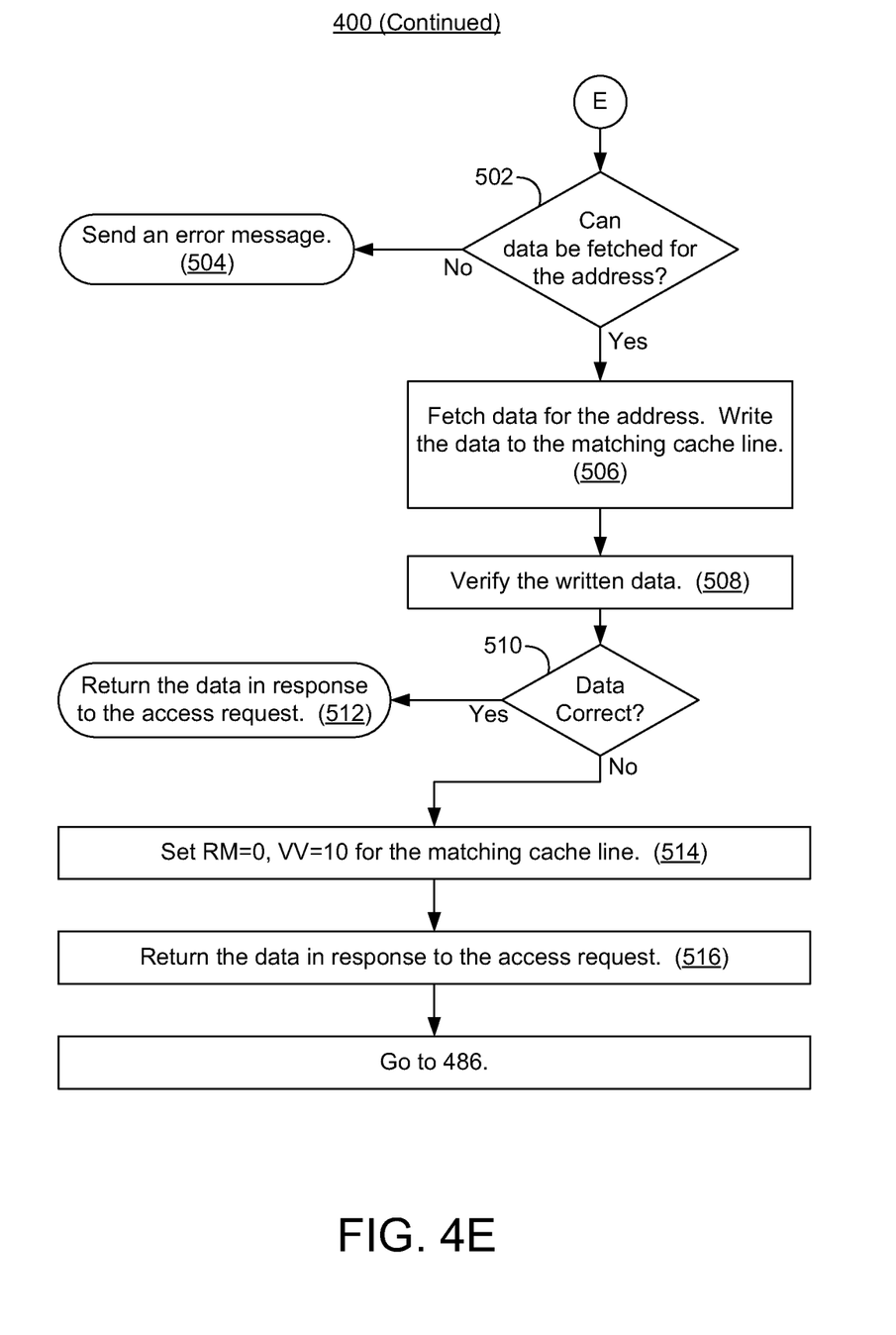
Figure 4F:
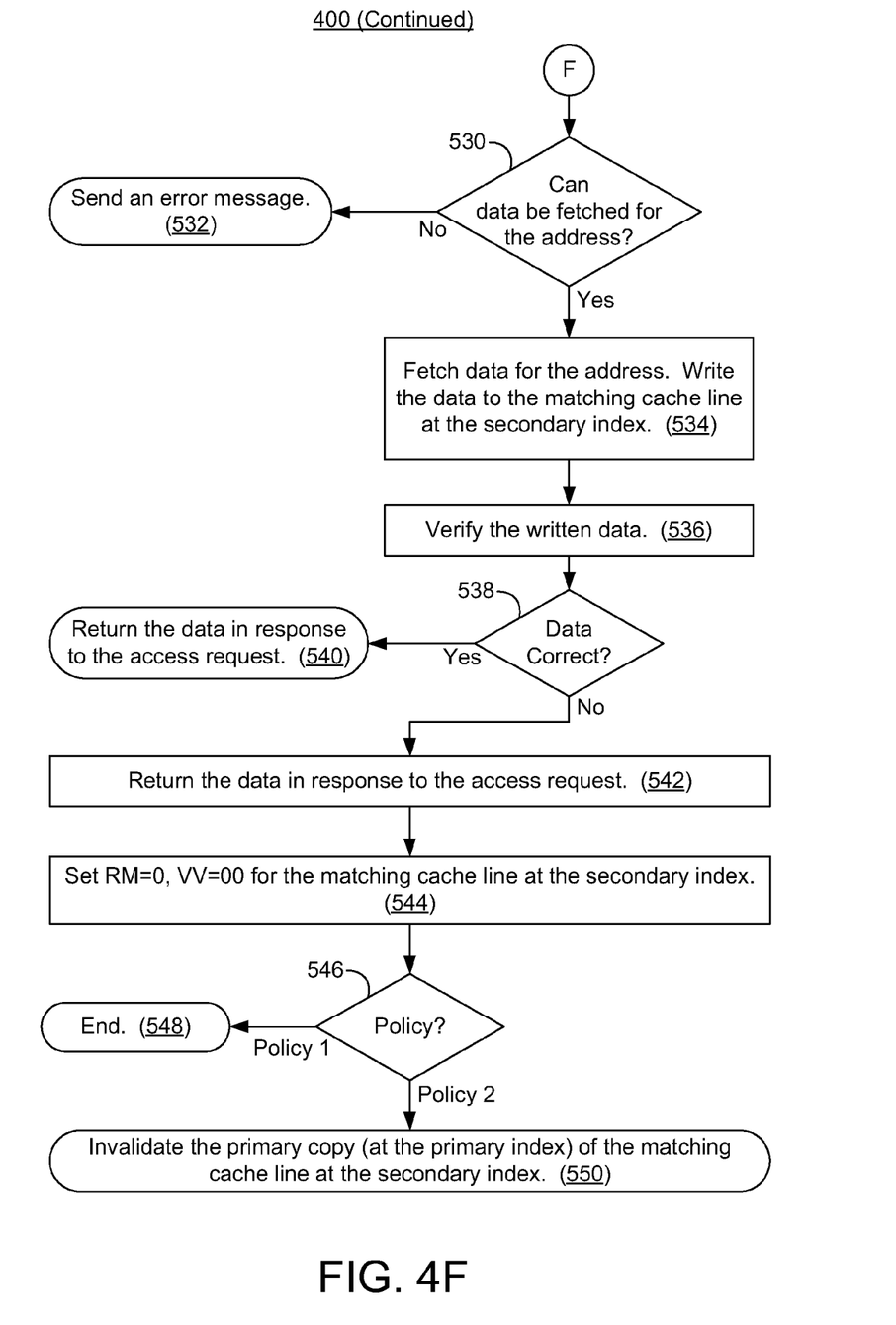

If RM=0, the tag match indicates a cache hit. If RM=0, VV=11, and the error protection module 218 does not find an uncorrectable error in the matching cache line 216, then the data in the matching cache line 216 is returned (484) in response to the access request of operation 404 and the method 400 ends. If RM=0 and VV=10, then the mapping module 206 (FIG. 2) maps (486) the primary index to a secondary index, as described for operation 438. The secondary index is accessed (488). If RM=0, VV=11, and the error protection module 218 finds an uncorrectable error in the matching cache line 216, then the method 400 branches to operation 502 (FIG. 4E).

In the operation 502 (FIG. 4E), it is determined whether data for the address specified in the access request of operation 404 can fetched from a lower level of memory. If data cannot be fetched (502—No), an error message is generated and sent (504) for logging (e.g., to the MCA). If data can be fetched (502—Yes), the data is fetched (506) and written to the matching cache line 216. The written data is verified (508) (e.g., using the verification logic 208). If the data as written is determined to be correct (510—Yes), then the data is returned (512) in response to the access request of operation 404, and the method 400 ends. If the data as written is determined to be incorrect (510—No), then the status (e.g., in the entry 300) of the matching cache line 216 is set (514) to RM=0 and VV=10. The fetched data is returned (516) in response to the access request of operation 404 and the method proceeds to operation 486 followed by operation 488 (FIG. 4D).

If accessing (488) the secondary index does not result in a tag match (490—No), then the method 400 branches to operation 444 (FIG. 4B): a secondary victim is selected (444) and the method 400 proceeds as previously described.

If accessing (488) the secondary index results in a tag match (490—Yes), then it is determined (492) whether the matching cache line 216 has one or more errors (e.g., one or more uncorrectable errors). This determination is made, for example, by the error protection module 218. If no errors are found (492—No), then the status (e.g., in the entry 300) of the matching cache line 216 is checked (496). If RM=1 and VV=11, then a cache hit has occurred and the data in the matching cache line 216 is returned (499) in response to the access request of operation 404 (FIG. 4A). If RM=0 (for Policy 1), then a cache miss has occurred; the matching cache line 216 is a primary copy that happens to have the same tag as the address specified in the access request (i.e., aliasing has occurred). (Note that for Policy 2, a tag match will not occur at the secondary index for a cache line 216 with RM=0, because such a cache line 216 would be a primary copy that would have already been evicted.) When RM=0, the matching cache line 216 is selected (498) as a secondary victim and the method 400 branches to operation 452 (FIG. 4B).

When data is returned (499) in response to accessing (488) the secondary index, the data may be written (500) (e.g., simultaneously with being returned) to the appropriate cache line 216 (i.e., the primary copy) at the primary index. The data written to the primary copy may be verified using the verification logic 208: the data is read from the primary copy and compared to the data returned from the secondary copy in operation 499. If the data written to the primary copy is determined to be error-free, then the primary copy is set to an error-free status (e.g., VV=11) and the secondary copy is invalidated (e.g., VV=00). The data in the secondary copy need not be evicted if it is modified, because it has just been written to the primary copy.

If accessing (488) the secondary index results in a tag match (490—Yes) and one or more errors (e.g., one or more uncorrectable errors) are found (492—Yes) in the matching cache line 216, then it is determined (530, FIG. 4F) whether data for the address specified in the access request of operation 404 can be fetched from a lower level of memory. If not (530—No), an error message is generated and sent (532) (e.g., to the MCA). If the data can be fetched (530—Yes), however, then the data is fetched and written (534) to the matching cache line 216. The written data is verified (536) (e.g., using the verification logic 208 or error protection module 218). If the written data is determined to be correct (538—Yes), then the data is returned (540) in response to the access request of operation 404 and the method 400 ends. If the written data is not correct (538—No), then the fetched data is returned (542) in response to the access request of operation 404 and the status (e.g., in the entry 300) of the matching cache line 216 at the secondary index is updated to set (544) RM=0 and VV=00, thus invalidating the matching cache line 216 at the secondary index. If Policy 1 is being used (546-Policy 1), the method 400 then ends (548). If Policy 2 is being used (546-Policy 2), the primary copy (i.e., at the primary index) of the matching cache line 216 at the secondary index is invalidated (550) (e.g., by setting RM=0, VV=00) and the method 400 ends.

The method 400 provides run-time error protection (e.g., multi-bit error protection) against both intermittent and permanent errors. Also, by allowing faulty cache lines 216 (e.g., cache lines 216 with VV=10) to be selected as victims, the method 400 allows for reuse of cache lines 216 with intermittent errors or errors that are deactivated, such that the errors do not affect function, power, or performance. Furthermore, by using different indices as opposed to the same index for primary and secondary copies, the method 400 may reduce instructions-per-cycle (IPC) variation. In addition, the method 400 may be implemented in a cache memory that lacks parity or ECC protection (e.g., that lacks an error protection module 218, FIG. 2) in accordance with some embodiments.

In some embodiments, the method 400 is performed in a cache memory 200 that is unprotected (e.g., that lacks an error protection module 218, FIG. 2) but that verifies data by computing the correct data and comparing it to the data stored in a respective cache line 216. Examples of such a cache memory 200 include, but are not limited to, the branch target buffer and various predictor tables. Such buffers and tables store predictions (e.g., predicted target addresses). The cache memory is read each time a prediction is made and written each time a prediction is found to be incorrect, to correct the prediction. Data verification operations include computing correct data (e.g., a correct target address) and comparing the correct data to the prediction as read from the cache memory. If the data stored in the cache is found to be correct, its status is set to be error-free (e.g., VV=11). Also, the verification logic 208 may be used to verify write operations that are performed to correct mispredictions.

While the method 400 includes a number of operations that appear to occur in a specific order, it should be apparent that the method 400 can include more or fewer operations. An order of two or more operations may be changed, performance of two or more operations may overlap, and two or more operations may be combined into a single operation.

The foregoing description, for purpose of explanation, has been described with reference to specific embodiments. However, the illustrative discussions above are not intended to be exhaustive or to limit all embodiments to the precise forms disclosed. Many modifications and variations are possible in view of the above teachings. The disclosed embodiments were chosen and described to best explain the underlying principles and their practical applications, to thereby enable others skilled in the art to best implement various embodiments with various modifications as are suited to the particular use contemplated.

What is claimed is:

1. A method of managing cache memory, comprising:
    accessing a cache memory at a primary index that corresponds to an address specified in an access request;
    determining that the accessing does not result in a cache hit on a cache line with an error-free status; and
    in response to the determining:
        mapping the primary index to a secondary index;
        selecting a selected cache line at the secondary index;
        fetching data for the address;
        setting a status indicator for the selected cache line to indicate a first error status while fetching the data, wherein the selected cache line is excluded from consideration for being dropped or evicted when the status indicator indicates the first error status; and
        writing the data to the selected cache line at the secondary index.

2. The method of claim 1, wherein mapping the primary index to the secondary index comprises applying a hashing function to the primary index.

3. The method of claim 1, further comprising, after fetching the data, changing the status indicator for the selected cache line to indicate a status distinct from the first error status.

4. The method of claim 3, further comprising:
    checking for one or more errors in the data as written to the selected cache line; and
    finding no errors in the data as written to the selected cache line;
    wherein changing the status indicator comprises setting the status indicator to indicate that the selected cache line is valid and error-free.

5. The method of claim 4, wherein checking for one or more errors comprises:
    reading the data as written to the selected cache line; and
    comparing the data as written to the selected cache line to the data as fetched.

6. The method of claim 1, further comprising:
    checking for one or more errors in the data as written to the selected cache line;
    finding at least one error in the data as written to the selected cache line; and
    in response to finding at least one error, invalidating the selected cache line.

7. The method of claim 1, further comprising:
    performing an access to the secondary index that does not result in a tag match;
    wherein selecting the cache line at the secondary index comprises picking a victim in accordance with a replacement policy, in response to the access to the secondary index that does not result in a tag match.

8. The method of claim 1, further comprising:
    performing an access to the secondary index that results in a tag match for a respective cache line;
    wherein selecting the cache line at the secondary index comprises picking the respective cache line as a victim.

9. The method of claim 8, wherein:
    a status indicator for the respective cache line indicates that the respective cache line is valid and either is error-free or has a second error status distinct from the first error status; and
    the respective cache line is picked as the secondary victim in response to the status indicator.

10. The method of claim 1, wherein accessing the cache memory at the primary index results in a cache miss, the method further comprising:
    fetching the data in response to the cache miss;
    writing the data to a selected cache line at the primary index; and
    finding at least one error in the data as written to the selected cache line at the primary index;
    wherein the mapping is responsive to the finding.

11. The method of claim 10, wherein the finding comprises:
    reading the data from the selected cache line at the primary index; and
    comparing the data from the selected cache line at the primary index to the data as fetched.

12. The method of claim 10, further comprising setting a status indicator for the selected cache line at the primary index to indicate a first error status while fetching the data;
    wherein a replacement policy excludes cache lines with the first error status from selection as victim cache lines.

13. The method of claim 1, wherein accessing the cache memory at the primary index results in a tag match for a respective cache line that is a secondary copy of another cache line and has a status indicator set to indicate that the respective cache line is valid and error-free, the method further comprising:

writing the data to the respective cache line, in response to the tag match; and finding at least one error in the data as written to the respective cache line;

wherein the mapping is responsive to the finding.

14. The method of claim 1, wherein accessing the cache memory at the primary index results in a cache hit on a respective cache line with a status indicator set to indicate that the respective cache line has an error.

15. A cache controller, comprising:

a mapping module to map a primary index to a secondary index, wherein the primary index corresponds to an address specified in an access request;

a status indicator array to store status indicators for cache lines; and cache control logic to write data for the address to a cache line at the secondary index in response to a determination that an access at the primary index does not result in a cache hit on a cache line with an error-free status, the cache control logic to set a status indicator for the cache line at the secondary index to indicate a first error status while the data is being fetched, and the cache control logic comprising replacement logic to select the cache line at the secondary index and to exclude cache lines with the first error status from consideration for eviction.

16. The cache controller of claim 15, wherein:

the cache control logic comprises verification logic to check for one or more errors in the data as written to the cache line at the secondary index; and the cache control logic is to change the status indicator for the cache line at the secondary index to indicate a status distinct from the first error status, based on a result from the verification logic.

17. A method of managing cache memory, comprising:

accessing a cache memory at a primary index that corresponds to an address specified in an access request;

determining that the accessing results in a cache miss;

in response to determining that the accessing results in a cache miss, fetching data for the address;

writing the data at a location of a victim cache line at the primary index;

determining that the data as written at the location of the victim cache line at the primary index is incorrect;

in response to determining that the data as written at the location of the victim cache line at the primary index is incorrect, mapping the primary index to a secondary index;

selecting a selected cache line at the secondary index;

fetching the data;

setting a status indicator for the selected cache line to indicate a first error status while fetching the data, wherein the selected cache line is excluded from consideration for being dropped or evicted when the status indicator indicates the first error status; and writing the data to the selected cache line at the secondary index.

* * * * *